(12) United States Patent
Furuta

(10) Patent No.: US 10,516,074 B2
(45) Date of Patent: Dec. 24, 2019

(54) SEMICONDUCTOR DEVICE, LIGHT EMISSION ELEMENT ARRAY, OPTICAL PRINT HEAD, AND METHOD OF PRODUCING SEMICONDUCTOR DEVICE

(71) Applicant: Oki Data Corporation, Tokyo (JP)

(72) Inventor: Hironori Furuta, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 15/654,925

(22) Filed: Jul. 20, 2017

(65) Prior Publication Data

US 2018/0033908 A1   Feb. 1, 2018

(30) Foreign Application Priority Data

Jul. 28, 2016  (JP) ................. 2016-148001

(51) Int. Cl.
| | |
|---|---|
| *H01L 33/38* | (2010.01) |
| *H01L 33/00* | (2010.01) |
| *H01L 33/30* | (2010.01) |
| *H01L 27/15* | (2006.01) |
| *G03G 15/04* | (2006.01) |
| *H01L 25/075* | (2006.01) |
| *H01L 33/44* | (2010.01) |
| *H01L 33/62* | (2010.01) |
| *H01L 25/16* | (2006.01) |
| *H01L 33/36* | (2010.01) |

(52) U.S. Cl.
CPC ... *H01L 33/0016* (2013.01); *G03G 15/04036* (2013.01); *H01L 25/0753* (2013.01); *H01L 27/15* (2013.01); *H01L 33/305* (2013.01); *H01L 33/38* (2013.01); *H01L 25/167* (2013.01); *H01L 33/0062* (2013.01); *H01L 33/0079* (2013.01); *H01L 33/36* (2013.01); *H01L 33/44* (2013.01); *H01L 33/62* (2013.01)

(58) Field of Classification Search
CPC . H01L 33/0016; H01L 27/15; H01L 33/0062; H01L 33/62; H01L 33/44; H01L 33/38; H01L 33/305; G03G 15/04036
See application file for complete search history.

(56) References Cited

U.S. PATENT DOCUMENTS

| | | | | |
|---|---|---|---|---|
| 4,371,967 | A * | 2/1983 | Wada | H01S 5/305 148/33.4 |
| 5,500,541 | A * | 3/1996 | Terashima | H01L 27/0652 257/105 |
| 2004/0061133 | A1* | 4/2004 | Hayasi | H01L 23/4824 257/197 |

(Continued)

FOREIGN PATENT DOCUMENTS

JP       2015-109417 A      6/2015

*Primary Examiner* — Charles D Garber
*Assistant Examiner* — S M Sohel Imtiaz
(74) *Attorney, Agent, or Firm* — Metrolex IP Law Group, PLLC

(57) ABSTRACT

A semiconductor device includes: a p type first semiconductor layer that contains acceptors as impurities; an n type second semiconductor layer that is provided on the first semiconductor layer and contains donors as impurities; and a p type first diffusion portion that includes a contact portion in contact with the first semiconductor layer, the contact portion containing acceptors whose concentration is higher than that in the first semiconductor layer.

15 Claims, 11 Drawing Sheets

(56) References Cited

U.S. PATENT DOCUMENTS

| | | | | |
|---|---|---|---|---|
| 2005/0224896 A1* | 10/2005 | Wu | ............... | H01L 29/0653 257/408 |
| 2007/0075330 A1* | 4/2007 | Ogihara | ............... | B41J 2/45 257/134 |
| 2012/0251181 A1* | 10/2012 | Nagumo | ............ | G03G 15/04054 399/177 |
| 2012/0309121 A1* | 12/2012 | Yoneda | ............ | H01S 5/02272 438/31 |
| 2013/0020592 A1* | 1/2013 | Kondo | ............ | B41J 2/45 257/88 |
| 2016/0365476 A1* | 12/2016 | Taylor | ............ | H01L 33/0075 |

* cited by examiner light emission element array light emission thyristor solid phase diffusion light emission thyristor solid phase diffusion light emission thyristor solid phase diffusion separation bonding npn bipolar transistor solid phase diffusion pnp bipolar transistor solid phase diffusion optical print head

SEMICONDUCTOR DEVICE, LIGHT EMISSION ELEMENT ARRAY, OPTICAL PRINT HEAD, AND METHOD OF PRODUCING SEMICONDUCTOR DEVICE

CROSS REFERENCE TO RELATED APPLICATIONS

This application claims priority based on 35 USC 119 from prior Japanese Patent Application No. 2016-148001 filed on Jul. 28, 2016, entitled "SEMICONDUCTOR DEVICE, LIGHT EMISSION ELEMENT ARRAY, OPTICAL PRINT HEAD, AND METHOD OF PRODUCING SEMICONDUCTOR DEVICE", the entire contents of which are incorporated herein by reference.

BACKGROUND

1. Field

The present disclosure relates to a semiconductor device, a light emission element array including light emission elements as semiconductor devices, an optical print head including a light emission element array, and a method of producing a semiconductor device.

2. Description of Related Art

An optical print head including a light emission thyristor array (a light emission element array) including light emission thyristors (light emission elements) is proposed as an exposure device for an electrophotographic image formation device (for example, refer to Patent Literature 1: Japanese Unexamined Patent Application Publication No. 2015-109417). The light emission thyristor described in Patent Literature 1 has a stacked structure (npnp structure or pnpn structure) in which a first conductivity type (p type or n type) anode layer (a first semiconductor layer), a second conductivity type gate layer (a second semiconductor layer) which has a conductivity type opposite to the first conductivity type, a first conductivity type gate layer (a third semiconductor layer), and a second conductivity type cathode layer (a fourth semiconductor layer) are stacked. For example, in a case where the first conductivity type is a p type, an anode electrode is formed on a p type anode layer (a first semiconductor layer), a cathode electrode is formed on an n type cathode layer (a fourth semiconductor layer), and a gate electrode is formed on a p type gate layer (a third semiconductor layer), it is possible to control conduction between an anode and a cathode by a gate signal.

SUMMARY

In the light emission thyristor, in a case where a semiconductor layer in which a gate electrode is formed is a p type gate layer, it is necessary to increase an impurity concentration of the p type gate layer in order to form good contact between the gate electrode and the p type gate layer. However, in a case where the impurity concentration of the p type gate layer is increased, a proportion of combination between electrons that have been injected from the cathode electrode to the p type gate layer (the third semiconductor layer) through the n type cathode layer (the fourth semiconductor layer) and holes of the p type gate layer (the third semiconductor layer) increases. Thus, the number of electrons that reach the n type gate layer (the second semiconductor layer) decreases. As a result, switching characteristics of the light emission thyristor deteriorate and deterioration in characteristics such as an increase in gate current occurs.

An object of an embodiment is to provide a semiconductor device that forms favorable contact between a p-type semiconductor layer and an electrode and has excellent characteristics, a light emission element array including the semiconductor device, an optical print head including the light emission element array, and a method of producing the semiconductor device.

A first aspect of the invention is a semiconductor device that includes: a p type first semiconductor layer that contains acceptors as impurities; an n type second semiconductor layer that is provided on the first semiconductor layer and contains donors as impurities; and a p type first diffusion portion that includes a contact portion in contact with the first semiconductor layer, the contact portion containing acceptors whose concentration is higher than that in the first semiconductor layer.

A second aspect of the invention is a method of producing a semiconductor device. The method includes: forming a p type first semiconductor layer containing acceptors as impurities, and an n type second semiconductor layer containing donors as impurities on the first semiconductor layer; and forming a p type first diffusion portion including a contact portion in contact with the first semiconductor layer by a solid phase diffusion method, the contact portion containing acceptors whose concentration is higher than that in the first semiconductor layer.

A third aspect of the invention is a method of producing a semiconductor device. The method includes: forming a p type first semiconductor layer containing acceptors as impurities, and an n type second semiconductor layer containing donors as impurities on the first semiconductor layer; partially etching the second semiconductor layer to form a region with a second thickness that is thinner than a first thickness in the second semiconductor layer including a region with the first thickness; and forming by a solid phase diffusion method: in the region with the second thickness of the second semiconductor layer, a p type first diffusion portion including a contact portion in contact with the first semiconductor layer, the contact portion containing acceptors whose concentration is higher than that in the first semiconductor layer; and in the region with the first thickness of the second semiconductor layer, a p type second diffusion portion that includes a bottom in the second semiconductor layer, is in contact with the second semiconductor layer, and contains acceptors as impurities.

According to the first aspect, it is possible to form favorable contact between a p-type semiconductor layer and an electrode, obtain excellent switching characteristics, and prevent a control current such as a gate current from increasing.

According to the second aspect, it is possible to provide a semiconductor device through which it is possible to form favorable contact between a p-type semiconductor layer and an electrode, obtain excellent switching characteristics, and prevent a gate current from increasing.

According to the third aspect, it is possible to produce a first diffusion portion and a second diffusion portion in a single solid phase diffusion process. Therefore, it is possible to simplify a production process and reduce production costs.

DETAILED DESCRIPTION OF EMBODIMENTS

Figure 1:
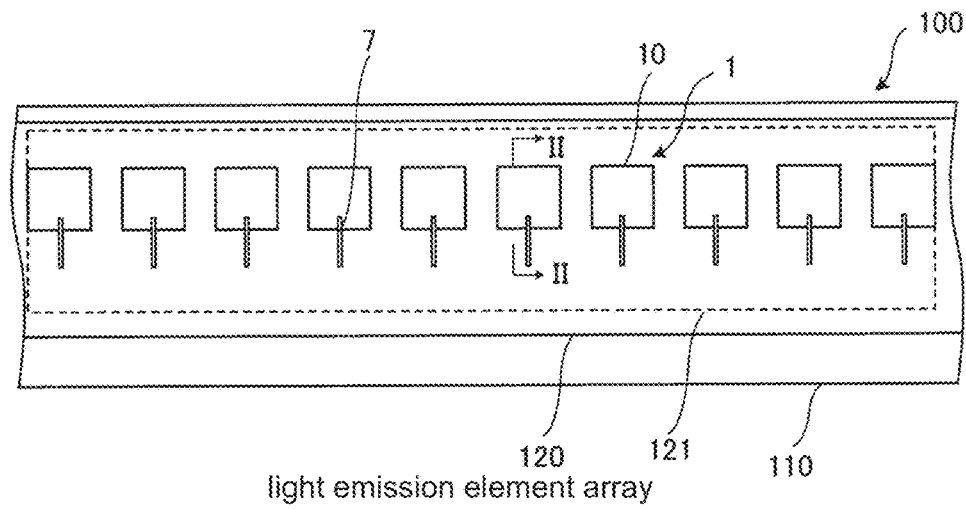
FIG. 1 is a schematic plan view of a light emission element array according to one or more embodiments.

Descriptions are provided hereinbelow for embodiments based on the drawings. In the respective drawings referenced herein, the same constituents are designated by the same reference numerals and duplicate explanation concerning the same constituents is omitted. All of the drawings are provided to illustrate the respective examples only.

<1> First Embodiment

<1-1> Light Emission Element Array 100

FIG. 1 is a plan view of a schematic structure of light emission element array 100 including semiconductor device 1 according to one or more embodiments. Light emission element array 100 is mounted on an optical print head as an exposure device in an electrophotographic image formation device. As illustrated in FIG. 1, light emission element array 100 includes, for example, chip on board (COB) substrate 110, semiconductor substrate 120 as a substrate mounted on COB substrate 110, and semiconductor devices 1 (light emission thyristors 10 as light emission elements) mounted on semiconductor substrate 120. Semiconductor substrate 120 and semiconductor devices 1 (light emission thyristors 10) form a light emission element array chip. Here, the optical print head is described in a sixth embodiment (to be described below).

Semiconductor substrate 120 is, for example, a silicon (Si) substrate, and incorporates drive circuit 121, which is an integrated circuit for driving light emission thyristor 10. However, drive circuit 121 may be provided on semiconductor substrate 120 or COB substrate 110 as an integrated circuit chip instead of being built thereinto.

Semiconductor device 1 including light emission thyristor 10 is formed on, for example, a production substrate (for example, reference numeral 150 in FIG. 3A to be described below). Semiconductor device 1 (for example, an epitaxial film as a thin film having a semiconductor stack structure that is formed through epitaxial growth, impurity injection, or solid phase diffusion) is separated from the production substrate (for example, FIG. 3E to be described below). Then, separated semiconductor device 1 is adhered to a main surface of semiconductor substrate 120 (for example, FIG. 3F to be described below).

Wiring 7 is a wiring layer or a wire that is formed of a conductive member for electrically connecting semiconductor device 1 to drive circuit 121. Here, in a case where wiring 7 is to be formed as a wiring layer along a surface of semiconductor device 1, before the wiring layer is formed, an insulating layer is formed in a region other than electrodes on semiconductor device 1 and a region other than electrodes on semiconductor substrate 120. In addition, the structure in FIG. 1 is only an example of a light emission element array to which the invention can be applied. The structure of the light emission element array is not limited to the structure in FIG. 1.

<1-2> Semiconductor Device 1

Figure 2:
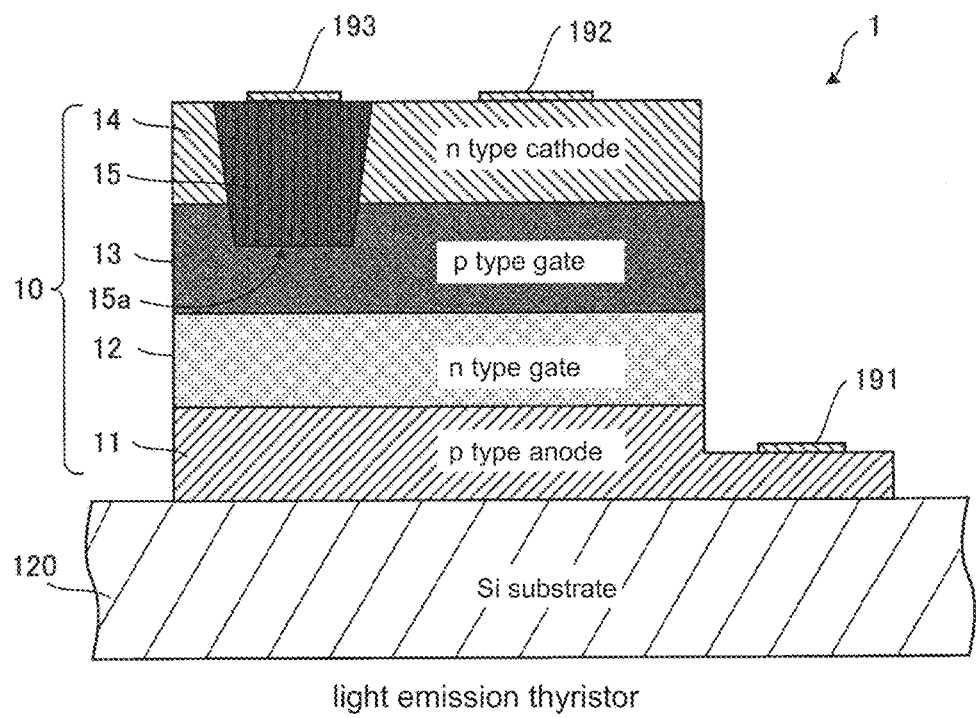
FIG. 2 is a schematic cross-sectional view of a structure of a semiconductor device (a light emission thyristor) according to a first embodiment.

FIG. 2 is a schematic cross-sectional view of a structure (a cross section taken along the line II-II in FIG. 1) of semiconductor device 1 (light emission thyristor 10). As illustrated in FIG. 1 and FIG. 2, semiconductor device 1 includes semiconductor substrate 120 as a substrate and light emission thyristor 10 that is provided on semiconductor substrate 120 and serves as a light emission element driven by drive circuit 121.

As illustrated in FIG. 2, light emission thyristor 10 includes p type third semiconductor layer (p type anode layer) 11 containing acceptors as impurities and n type fourth semiconductor layer (n type gate layer) 12 that is provided on p type anode layer 11 and contains donors as impurities. In addition, light emission thyristor 10 includes p type first semiconductor layer (p type gate layer) 13 that is provided on n type gate layer 12 and contains acceptors, n type second semiconductor layer (n type cathode layer) 14 that is provided on p type gate layer 13 and contains donors, and p type first diffusion portion 15 which includes contact portion 15a in contact with p type gate layer 13 and in which contact portion 15a contains acceptors whose concentration is higher than that in p type gate layer 13. In addition, first diffusion portion 15 penetrates n type cathode layer 14 and has a bottom in p type gate layer 13 midway through in a thickness direction thereof (a depth direction).

For example, in the first embodiment, p type anode layer 11 is a p type AlGaAs (aluminum-gallium-arsenic) layer, n type gate layer 12 is an n type AlGaAs layer, p type gate layer 13 is a p type AlGaAs layer, and n type cathode layer 14 is an n type AlGaAs layer. In these layers, carbon (C) or zinc (Zn) is used as a p type impurity, and silicon (Si) is used as an n type impurity. In addition, first diffusion portion 15 is formed by, for example, locally diffusing Zn into n type cathode layer 14 and p type gate layer 13 using a solid phase diffusion method.

A surface on which anode electrode 191 is formed is formed by, for example, wet etching partially n type cathode layer 14, p type gate layer 13, n type gate layer 12, and p type anode layer 11 using a mixed solution of phosphoric acid, aqueous hydrogen peroxide, and water, or the like. Cathode electrode 192 is formed on an upper surface of n type cathode layer 14. Gate electrode 193 is formed on an upper surface of first diffusion portion 15.

In semiconductor device 1 according to the first embodiment, when drive circuit 121 (FIG. 1) transmits a signal (a gate current) to gate electrode 193 of light emission thyristor 10 as a light emission element, the state between p type anode layer 11 and n type cathode layer 14 is set to on, and when a current flows between p type anode layer 11 and n type cathode layer 14 according to an anode signal (or a cathode signal) supplied by drive circuit 121 (FIG. 1), p type gate layer 13 of light emission thyristor 10 is caused to emit light. However, layers of the light emission thyristor can be formed to cause either an n type gate layer or an n type cathode layer of the light emission thyristor to emit light. In addition, when an anode signal (or a cathode signal) is set to a predetermined level or less, the state between p type anode layer 11 and n type cathode layer 14 is set to off.

In the first embodiment, when drive circuit 121 transmits a gate signal to light emission thyristor 10, any light emission thyristor is set to on, and when an anode signal or a cathode signal flows in the on state, any light emission thyristor emits light.

<1-3> Process of Producing Semiconductor Device 1

FIGS. 3A to 3F illustrate schematic cross sections to explain a method of producing semiconductor device 1 (light emission thyristor 10). Semiconductor device 1 is produced on production substrate 150 that is different from semiconductor substrate 120 illustrated in FIG. 2.

Figure 3A:
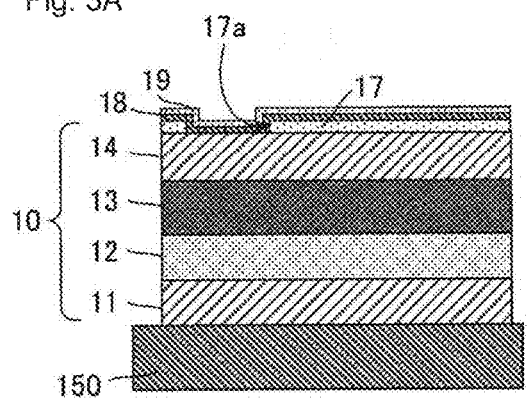
FIGS. 3A to 3F illustrate schematic cross sections for explaining a method of producing the semiconductor device (the light emission thyristor).

First, as illustrated in FIG. 3A, a stacked structure including p type anode layer (p type AlGaAs layer) 11, n type gate layer (n type AlGaAs layer) 12, p type gate layer (p type AlGaAs layer) 13, and n type cathode layer (n type AlGaAs layer) 14 is formed on p type GaAs substrate 150 serving as a production substrate through epitaxial growth and impurity injection. Next, diffusion mask (for example, AlN film) 17 including opening 17a is formed on n type cathode layer 14, diffusion source film (for example, ZnO) 18 is formed, and annealing cap film 19 is formed.

Figure 3D:
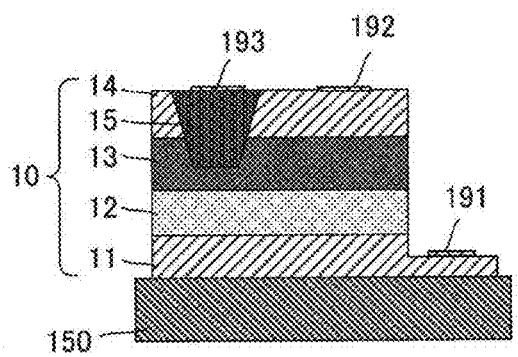
Figure 3B:
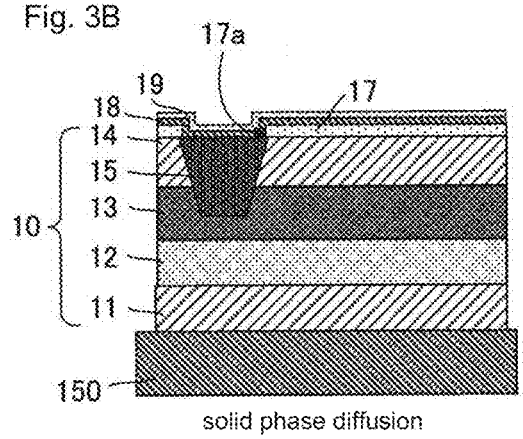

Next, as illustrated in FIG. 3B, Zn is diffused in a solid-phase manner through annealing, and p type first diffusion portion 15 is formed.

Figure 3E:
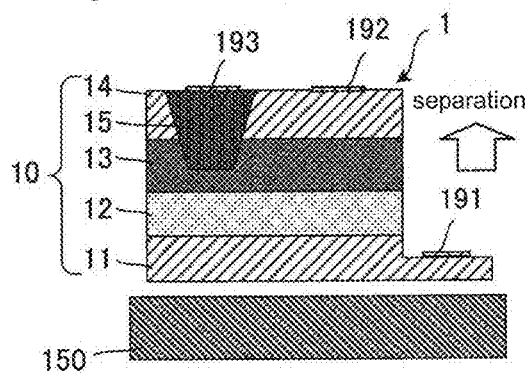
Figure 3C:
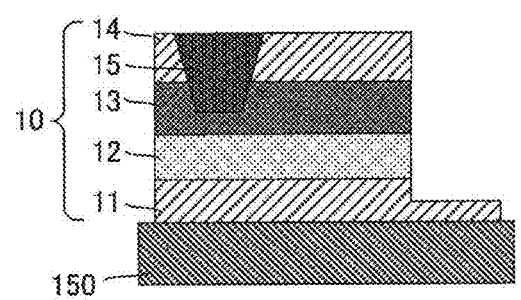

Next, as illustrated in FIG. 3C, annealing cap film 19, diffusion source film 18, and diffusion mask 17 are removed. N type cathode layer 14, p type gate layer 13, n type gate layer 12, and p type anode layer 11 are partially etched by, for example, wet etching using a mixed solution of phosphoric acid, aqueous hydrogen peroxide, and water, or the like. Thus, p type anode layer 11 is partially exposed.

Next, as illustrated in FIG. 3D, anode electrode 191 is formed on p type anode layer 11, cathode electrode 192 is formed on n type cathode layer 14, and gate electrode 193 is formed on first diffusion portion 15. Thus, light emission thyristor 10 is formed. In addition, light emission thyristor 10 is, for example, an epitaxial film, and can be separated from production substrate 150 by etching and bonded to another substrate.

Figure 3F:
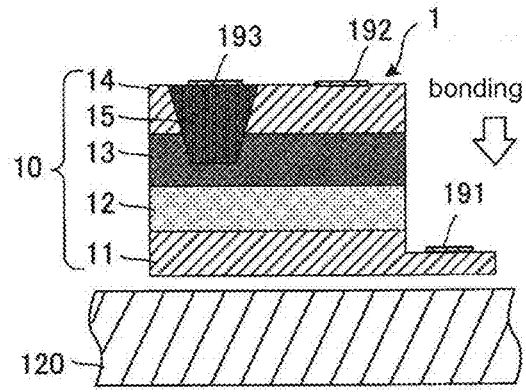

Next, as illustrated in FIG. 3E, light emission thyristor 10 is separated from production substrate 150 while being held by a holding device (for example, adhered or suctioned). Next, as illustrated in FIG. 3F, separated light emission thyristor 10 is moved onto semiconductor substrate 120, and is adhered to a predetermined position on semiconductor substrate 120. By repeating this process, light emission thyristors (light emission elements) 10 are formed on semiconductor substrate 120. Then, for each of semiconductor devices 1, anode electrode 191, cathode electrode 192, and gate electrode 193 are electrically connected to electrode portions of drive circuit 121. As described above, a light emission element array chip (a light emission thyristor array chip) including semiconductor device 1 illustrated in FIG. 1 and FIG. 2 is formed.

<1-4> Effects

As described above, according to semiconductor device 1, first diffusion portion 15 that is formed by diffusing Zn in a solid-phase manner is set as a p type gate region for making ohmic contact with gate electrode 193. This makes it possible to locally (only in first diffusion portion 15) increase an impurity concentration without increasing an impurity concentration of p type gate layer 13 formed through epitaxial growth. Therefore, it is possible to form favorable contact between first diffusion portion 15 and p type gate layer 13. In addition, since an impurity concentration of p type gate layer 13 does not increase, a proportion of combination (recombination) between electrons that have been injected into p type gate layer 13 from cathode electrode 192 through n type cathode layer 14 and holes of p type gate layer 13 does not increase, and reduction in the number of electrons that reach n type gate layer 12 is slight. As a result, switching characteristics of the light emission thyristor do not deteriorate and deterioration in characteristics such as an increase in gate current does not occur.

<2> Second Embodiment

<2-1> Semiconductor Device 2

Figure 4:
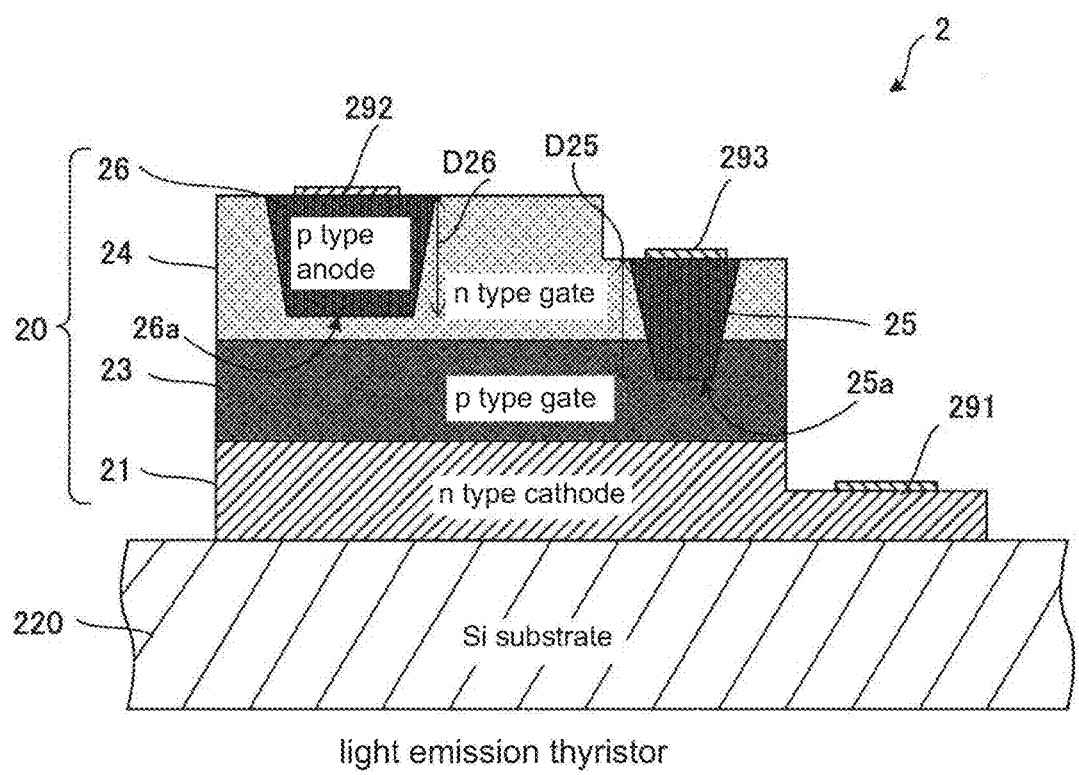
FIG. 4 is a schematic cross-sectional view of a structure of a semiconductor device (a light emission thyristor) according to a second embodiment.

FIG. 4 is a schematic cross-sectional view of a structure of semiconductor device 2 (light emission thyristor 20) according to a second embodiment. As illustrated in FIG. 4, semiconductor device 2 includes semiconductor substrate 220 as a substrate and light emission thyristor 20 that is provided on semiconductor substrate 220 and that is driven by a drive circuit.

As illustrated in FIG. 4, light emission thyristor 20 includes n type third semiconductor layer (n type cathode layer) 21 containing donors as impurities, p type first semiconductor layer (p type gate layer) 23 that is provided on n type cathode layer 21 and contains acceptors as impurities, n type second semiconductor layer (n type gate layer) 24 that is provided on p type gate layer 23 and contains donors, and p type first diffusion portion 25 which includes contact portion 25a in contact with p type gate layer 23 and in which contact portion 25a contains acceptors whose concentration is higher than that in p type gate layer 23. First diffusion portion 25 penetrates n type gate layer 24 and has a bottom in p type gate layer 23 midway through in a thickness direction thereof (a depth direction). In addition, light emission thyristor 20 includes p type second diffusion portion (p type anode layer) 26 that has bottom 26a in second semiconductor layer 24 midway through in a thickness direction thereof (a depth direction), that is in contact with second semiconductor layer 24, and that contains acceptors.

N type gate layer 24 includes a region with a first thickness and a region with a second thickness that is thinner than the first thickness. First diffusion portion 25 is arranged in the region with the second thickness. Second diffusion portion 26 is arranged in the region with the first thickness. In a case where first diffusion portion 25 and second diffusion portion 26 are formed in the same process, height D25 of first diffusion portion 25 in the depth direction (the thickness direction) and height D26 of second diffusion portion 26 in the depth direction are the same.

For example, in the second embodiment, n type cathode layer 21 is an n type AlGaAs layer, p type gate layer 23 is a p type AlGaAs layer, and n type gate layer 24 is an n type AlGaAs layer. Impurities used are the same as those in the first embodiment.

A surface on which cathode electrode 291 is formed is formed by wet etching partially n type gate layer 24, p type gate layer 23, and n type cathode layer 21. Cathode electrode 291 is formed on an upper surface of n type cathode layer 21. Gate electrode 293 is formed on an upper surface of first diffusion portion 25. Anode electrode 292 is formed on an upper surface of second diffusion portion (p type anode layer) 26.

In semiconductor device 2, when a gate signal (a gate current) is transmitted to gate electrode 293, the state between p type anode layer 26 and n type cathode layer 21 is set to on, and when a current flows between p type anode layer 26 and n type cathode layer 21 according to an anode signal (or a cathode signal) supplied by drive circuit 121 (FIG. 1), p type gate layer 23 of light emission thyristor 20 is caused to emit light. In addition, when an anode signal (or a cathode signal) is set to a predetermined level or less, the state between p type anode layer 26 and n type cathode layer 21 is set to off.

<2-2> Process of Producing Semiconductor Device 2

FIGS. 5A to 5F illustrate schematic cross sections to explain a method of producing semiconductor device 2 (light emission thyristor 20). Semiconductor device 2 is produced on production substrate 150 that is different from semiconductor substrate 220 illustrated in FIG. 4.

Figure 5A:
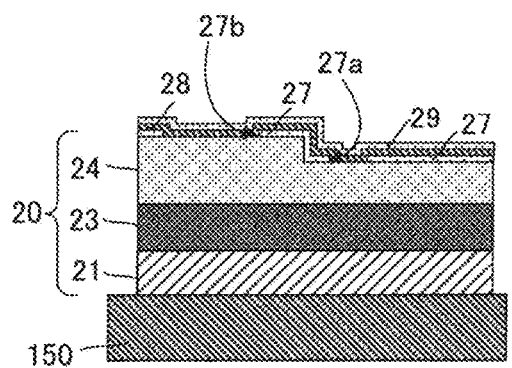
FIGS. 5A to 5F illustrate schematic cross sections for explaining a method of producing the semiconductor device (the light emission thyristor).

First, as illustrated in FIG. 5A, a stacked structure including n type cathode layer 21, p type gate layer 23, and n type gate layer 24 is formed on production substrate 150 through epitaxial growth and impurity injection. Next, in n type gate layer 24, a region with a first thickness and a region with a second thickness that is thinner than the first thickness are formed by, for example, wet etching. Next, diffusion mask 27 including openings 27a and 27b is formed on n type gate layer 24, diffusion source film (for example, ZnO) 28 is formed, and annealing cap film 29 is formed.

Figure 5D:
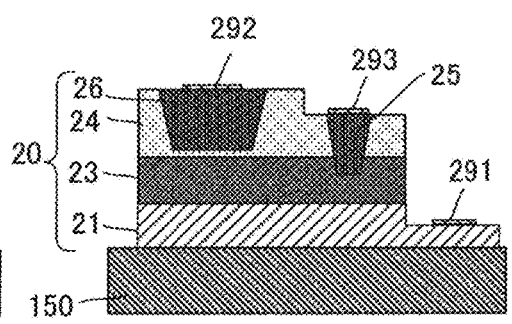
Figure 5B:
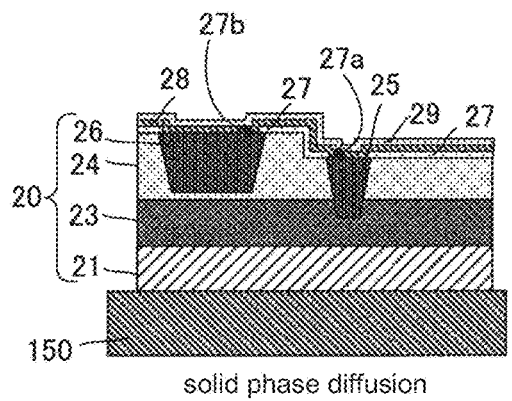

Next, as illustrated in FIG. 5B, Zn is diffused in a solid-phase manner through annealing, and p type first diffusion portion 25 and p type second diffusion portion 26 are formed.

Figure 5E:
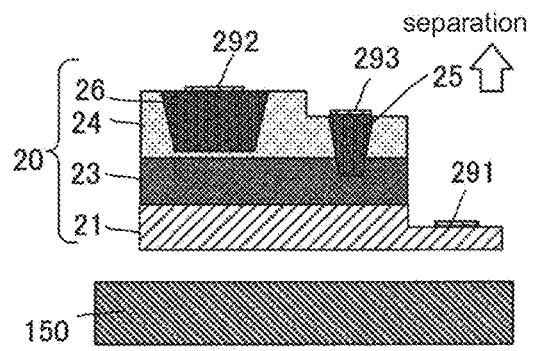
Figure 5C:
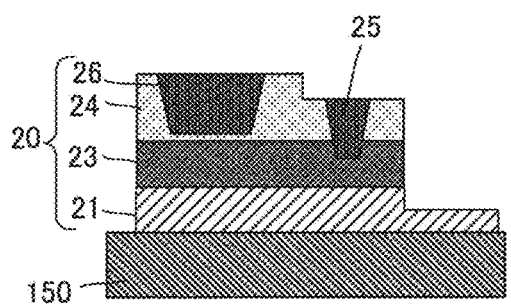

Next, as illustrated in FIG. 5C, annealing cap film 29, diffusion source film 28, and diffusion mask 27 are removed. N type gate layer 24, p type gate layer 23, and n type cathode layer 21 are partially etched by, for example, wet etching.

Next, as illustrated in FIG. 5D, cathode electrode 291, anode electrode 292, and gate electrode 293 are formed. Thus, light emission thyristor 20 is formed.

Figure 5F:
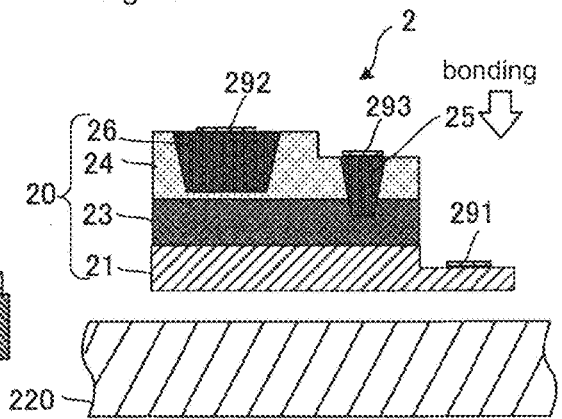

Next, as illustrated in FIG. 5E, light emission thyristor 20 is separated from production substrate 150 while being held by a holding device. As illustrated in FIG. 5F, separated light emission thyristor 20 is moved onto semiconductor substrate 220, and is adhered to a predetermined position on semiconductor substrate 220. By repeating this process, light emission thyristors 20 (light emission element parts) are formed on semiconductor substrate 220.

<2-3> Effects

As described above, according to semiconductor device 2, first diffusion portion 25 formed by diffusing Zn in a solid-phase manner is set as a p type gate region for making ohmic contact with gate electrode 293. This makes it possible to locally (only in first diffusion portion 25) increase an impurity concentration without increasing an impurity concentration of p type gate layer 23 formed through epitaxial growth. Therefore, it is possible to form favorable contact between first diffusion portion 25 and p type gate layer 23.

In addition, according to semiconductor device 2, in solid phase diffusion illustrated in FIG. 5B, since an impurity concentration of p type gate layer 23 does not increase, a proportion of combination (recombination) between electrons that have been injected into p type gate layer 23 from cathode electrode 291 through n type cathode layer 21 and holes of p type gate layer 23 does not increase, and reduction in the number of electrons that reach n type gate layer 24 is slight. As a result, switching characteristics of light emission thyristor 20 do not deteriorate and deterioration in characteristics such as an increase in gate current does not occur.

In addition, according to semiconductor device 2, second diffusion portion 26 serving as an anode region is formed by diffusing Zn in a solid-phase manner, and therefore it is possible to reduce the number of layers stacked. Moreover, diffusion depths of second diffusion portion 26 and first diffusion portion 25 are the same, and therefore it is possible to perform formation in a single process and simplify the production process.

<3> Third Embodiment

<3-1> Semiconductor Device 3

Figure 6:
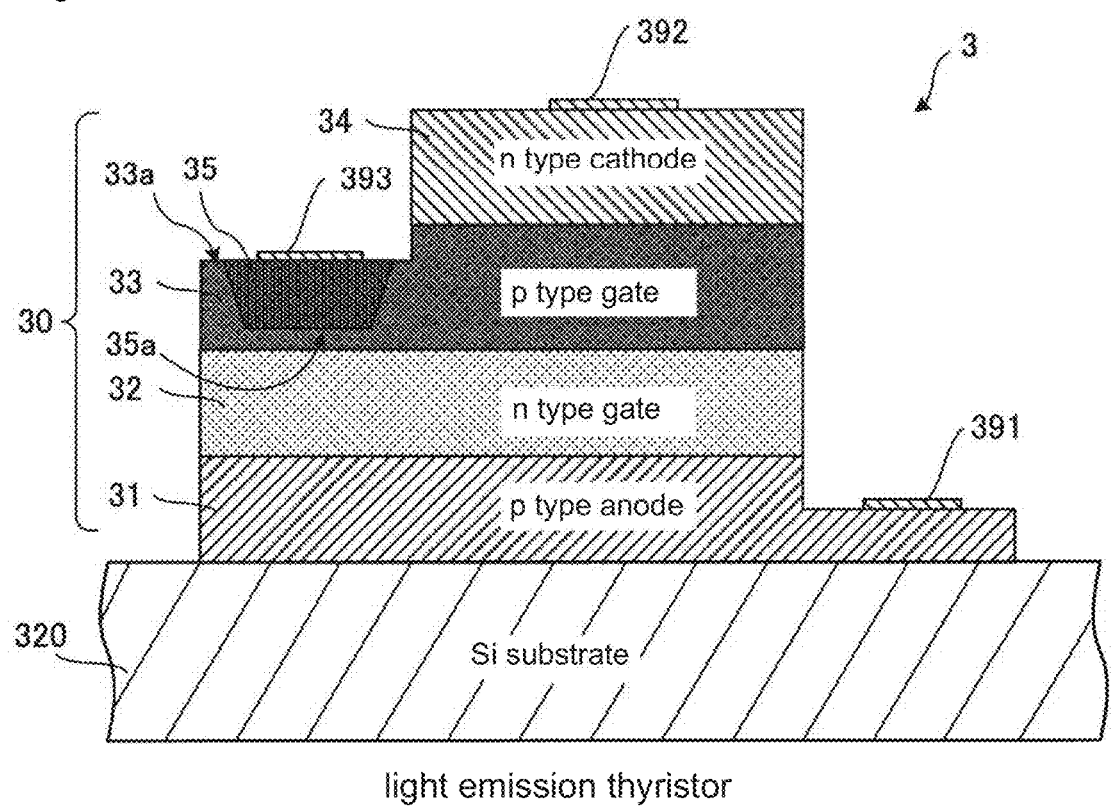
FIG. 6 is a schematic cross-sectional view of a structure of a semiconductor device (a light emission thyristor) according to a third embodiment.

FIG. 6 is a schematic cross-sectional view of a structure of semiconductor device 3 (light emission thyristor 30) according to a third embodiment. As illustrated in FIG. 6, semiconductor device 3 according to the third embodiment includes semiconductor substrate 320 as a substrate and light emission thyristor 30 that is provided on semiconductor substrate 320 and that is driven by a drive circuit.

As illustrated in FIG. 6, semiconductor device 3 includes p type first semiconductor layer (p type gate layer) 33 containing acceptors as impurities, n type second semiconductor layer (n type cathode layer) 34 that is provided on p type gate layer 33 and contains donors as impurities, and p type first diffusion portion 35 which includes contact portion 35a in contact with p type gate layer 33 and in which contact portion 35a contains acceptors whose concentration is higher than that in p type gate layer 33. P type gate layer 33 includes first region 33a that is not covered with n type cathode layer 34. First diffusion portion 35 includes, in first region 33a, a bottom in p type gate layer 33 midway through in the thickness direction thereof.

In addition, semiconductor device 3 further includes p type third semiconductor layer (p type anode layer) 31 containing acceptors and n type fourth semiconductor layer (n type gate layer) 32 that is provided on p type anode layer 31 and contains donors. P type gate layer 33 is provided on n type gate layer 32. Semiconductor device 3 includes light emission thyristor 30 that is controlled by a gate signal input to p type gate layer 13 through first diffusion portion 15.

In the third embodiment, materials of semiconductor layers 31 to 34 are the same as those of semiconductor layers 11 to 14 in the first embodiment. In addition, an impurity component of first diffusion portion 35 is the same as that of first diffusion portion 15 in the first embodiment.

A surface on which anode electrode 391 is formed is formed by, for example, wet etching partially n type cathode layer 34, p type gate layer 33, n type gate layer 32, and p type anode layer 31 using a mixed solution of phosphoric acid, aqueous hydrogen peroxide, and water, or the like. Cathode electrode 392 is formed on an upper surface of n type cathode layer 34. Gate electrode 393 is formed on an upper surface of first diffusion portion 35.

<3-2> Process of Producing Semiconductor Device 3

FIGS. 7A to 7F illustrate schematic cross sections to explain a method of producing semiconductor device 3

(light emission thyristor 30). Semiconductor device 3 is produced on production substrate 150 that is different from semiconductor substrate 320 illustrated in FIG. 6.

Figure 7A:
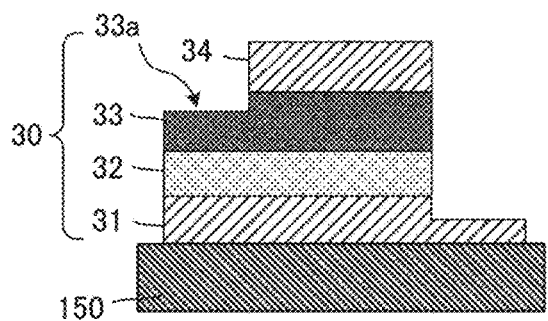
FIGS. 7A to 7F illustrate schematic cross sections to explain a method of producing the semiconductor device (the light emission thyristor).

First, as illustrated in FIG. 7A, a stacked structure including p type anode layer 31, n type gate layer 32, p type gate layer 33, and n type cathode layer 34 is formed on production substrate 150 through epitaxial growth and impurity injection. Next, n type cathode layer 34, p type gate layer 33, n type gate layer 32, and p type anode layer 31 are partially removed by wet etching, and first region 33a of p type gate layer 33 and an exposed region of p type anode layer 31 are formed.

Figure 7D:
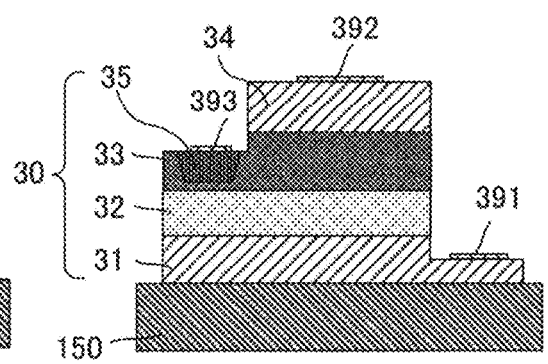
Figure 7B:
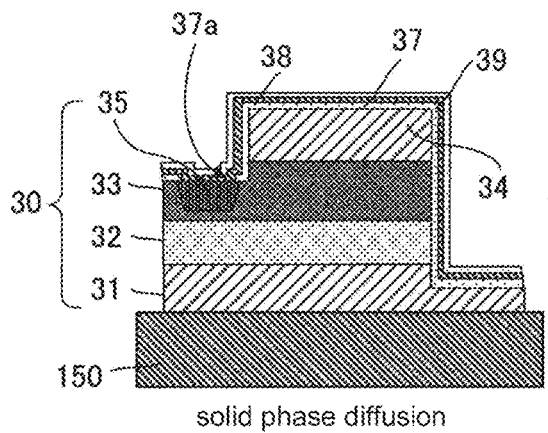

Next, as illustrated in FIG. 7B, diffusion mask 37 including opening 37a is formed on p type gate layer 33, diffusion source film (for example, ZnO) 38 is formed, and annealing cap film 39 is formed. Zn is diffused in a solid-phase manner through annealing, and p type first diffusion portion 35 is formed.

Figure 7E:
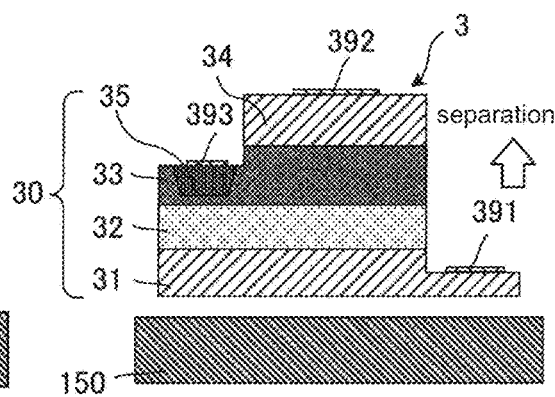
Figure 7C:
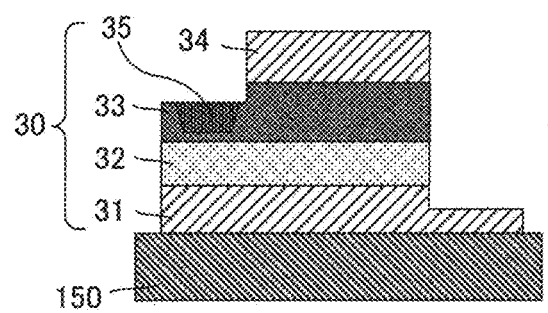

Next, as illustrated in FIG. 7C, annealing cap film 39, diffusion source film 38, and diffusion mask 37 are removed.

Next, as illustrated in FIG. 7D, anode electrode 391 is formed on p type anode layer 31, cathode electrode 392 is formed on n type cathode layer 34, and gate electrode 393 is formed on first diffusion portion 35. Thus, light emission thyristor 30 is formed.

Figure 7F:
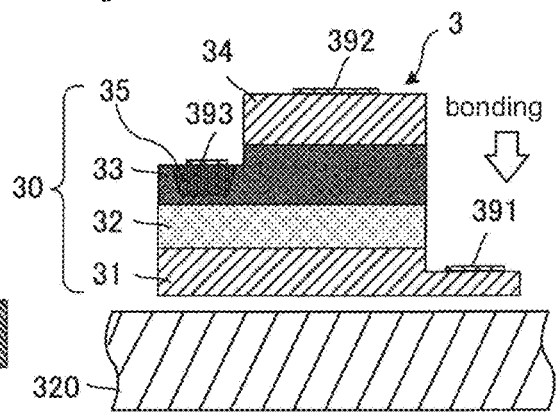

Next, as illustrated in FIG. 7E, light emission thyristor 30 is separated from production substrate 150 and is adhered to a predetermined position on semiconductor substrate 320 as illustrated in FIG. 7F.

<3-3> Effects

As described above, according to semiconductor device 3, first diffusion portion 35 formed by diffusing Zn in a solid-phase manner is used. This makes it possible to increase an impurity concentration of first diffusion portion 35 without increasing an impurity concentration of p type gate layer 33 formed through epitaxial growth. Therefore, it is possible to form favorable contact between first diffusion portion 35 and p type gate layer 33.

In addition, according to semiconductor device 3, in solid phase diffusion illustrated in FIG. 7B, since an impurity concentration of p type gate layer 33 does not increase, a proportion of combination (recombination) between electrons that have been injected into p type gate layer 33 from cathode electrode 392 through n type cathode layer 34 and holes of p type gate layer 33 does not increase, and reduction in the number of electrons that reach n type gate layer 32 is slight. As a result, switching characteristics of the light emission thyristor do not deteriorate and deterioration in characteristics such as an increase in gate current does not occur.

<4> Fourth Embodiment

<4-1> Semiconductor Device 4

Figure 8:
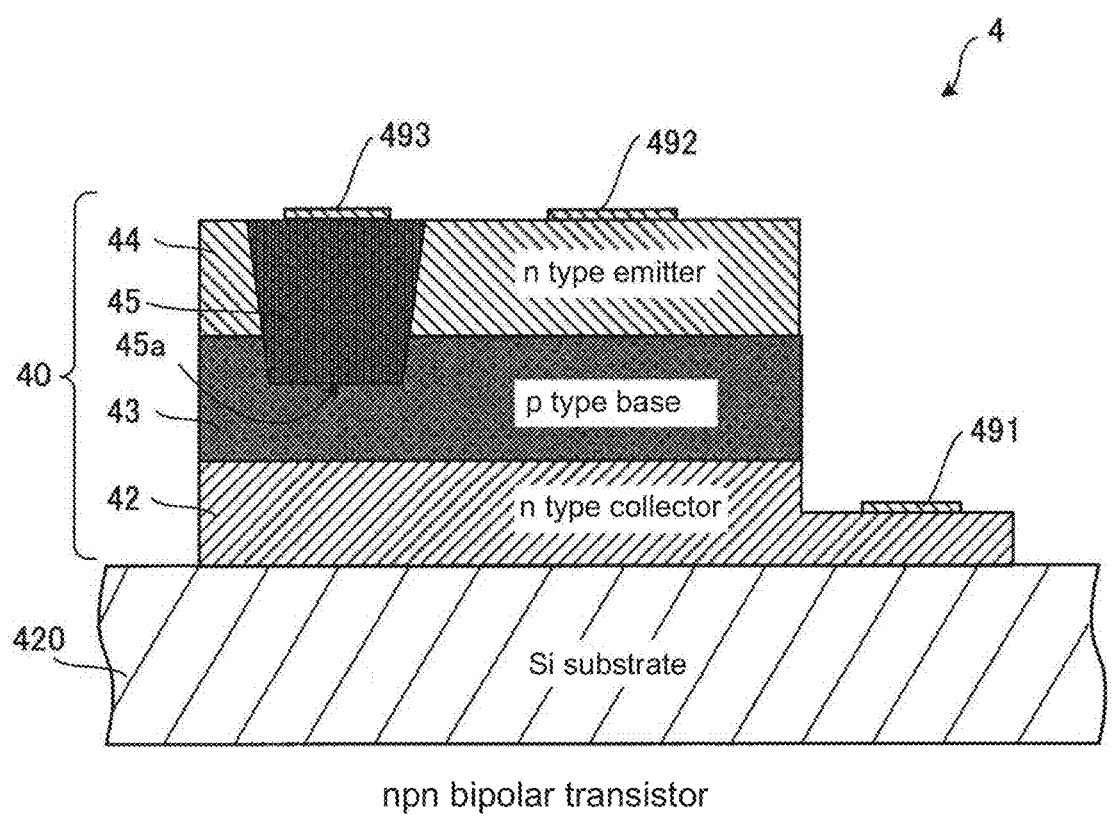
FIG. 8 is a schematic cross-sectional view of a structure of a semiconductor device (a bipolar transistor) according to a fourth embodiment.

FIG. 8 is a schematic cross-sectional view of a structure of semiconductor device 4 (npn bipolar transistor 40) according to a fourth embodiment. As illustrated in FIG. 8, semiconductor device 4 includes semiconductor substrate (Si substrate) 420 and npn bipolar transistor 40 that is provided on semiconductor substrate 420 and that is driven by a drive circuit.

As illustrated in FIG. 8, semiconductor device 4 includes n type third semiconductor layer (n type collector layer) 42 that is provided on Si substrate 420 and contains donors, p type first semiconductor layer (p type base layer) 43 that is provided on n type collector layer 42 and contains acceptors, n type second semiconductor layer (n type emitter layer) 44 that is provided on p type base layer 43 and contains donors, and p type first diffusion portion (first diffusion region) 45 which includes contact portion 45a in contact with p type base layer 43 and in which contact portion 45a contains acceptors whose concentration is higher than that in p type base layer 43. First diffusion portion 45 penetrates n type emitter layer 44 and has a bottom in p type base layer 43 midway through in the thickness direction thereof (the depth direction).

For example, in the fourth embodiment, n type collector layer 42 is an n type AlGaAs layer, p type base layer 43 is a p type AlGaAs layer, and n type emitter layer 44 is an n type AlGaAs layer. In these layers, C or Zn is used as a p type impurity, and Si is used as an n type impurity. In addition, first diffusion portion 45 is formed by, for example, diffusing Zn using a solid phase diffusion method. Emitter electrode 492 is formed on an upper surface of n type emitter layer 44. Base electrode 493 is formed on an upper surface of first diffusion portion 45. Collector electrode 491 is formed on an upper surface of n type collector layer 42.

<4-2> Process of Producing Semiconductor Device 4

FIGS. 9A to 9F illustrate schematic cross sections to explain a method of producing semiconductor device 4 (npn bipolar transistor 40). Semiconductor device 4 is produced on production substrate 150 that is different from semiconductor substrate 420 illustrated in FIG. 8.

Figure 9A:
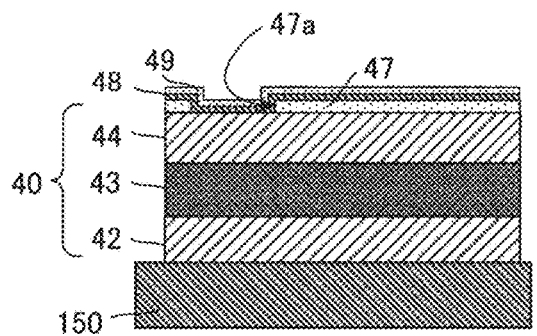
FIGS. 9A to 9F illustrate schematic cross sections for explaining a method of producing the semiconductor device (the bipolar transistor).

First, as illustrated in FIG. 9A, a stacked structure including n type collector layer 42, p type base layer 43, and n type emitter layer 44 is formed on production substrate 150 through epitaxial growth and impurity injection. Next, diffusion mask 47 including opening 47a is formed on n type emitter layer 44, diffusion source film (for example, ZnO) 48 is formed, and annealing cap film 49 is formed.

Figure 9D:
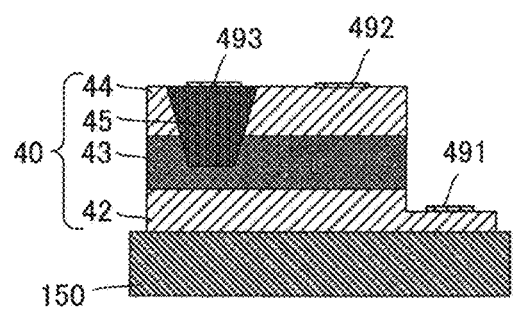
Figure 9B:
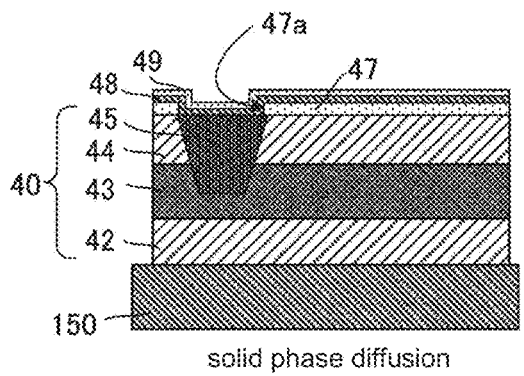

Next, as illustrated in FIG. 9B, Zn is diffused in a solid-phase manner through annealing, and p type first diffusion portion 45 is formed.

Figure 9E:
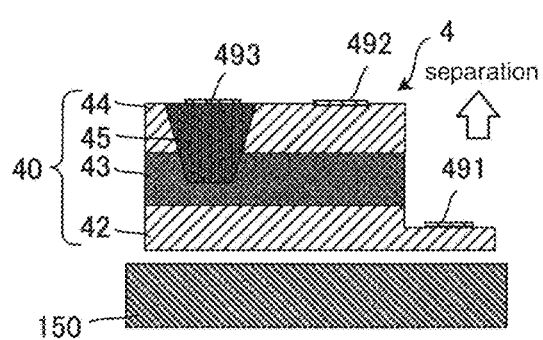
Figure 9C:
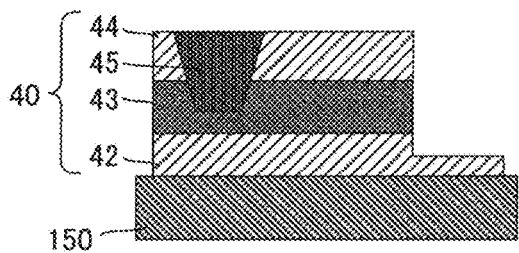

Next, as illustrated in FIG. 9C, annealing cap film 49, diffusion source film 48, and diffusion mask 47 are removed. N type emitter layer 44, p type base layer 43, and n type collector layer 42 are partially etched by, for example, wet etching, and n type collector layer 42 is partially exposed.

Figure 9F:
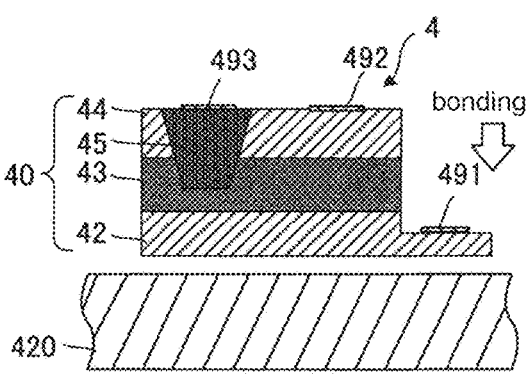

Next, as illustrated in FIG. 9D, collector electrode 491, emitter electrode 492, and base electrode 493 are formed. Thus, npn bipolar transistor 40 is formed. Npn bipolar transistor 40 is separated from production substrate 150 as illustrated in FIG. 9E and is adhered to a predetermined position on semiconductor substrate 420 as illustrated in FIG. 9F.

<4-3> Effects

As described above, according to semiconductor device 4 of the fourth embodiment, first diffusion portion 45 formed by diffusing Zn in a solid-phase manner is used. This makes it possible to increase an impurity concentration of first diffusion portion 45 without increasing an impurity concentration of p type base layer 43 formed through epitaxial growth. Therefore, it is possible to form favorable contact between first diffusion portion 45 and p type base layer 43.

In addition, according to semiconductor device 4, in solid phase diffusion illustrated in FIG. 9B, since an impurity concentration of p type base layer 43 increases only locally, a proportion of electrons which combine (recombine) with holes of p type base layer 43 does not increase, and characteristics of npn bipolar transistor 40 do not deteriorate and power consumption does not increase.

<5> Fifth Embodiment

<5-1> Semiconductor Device 5

Figure 10:
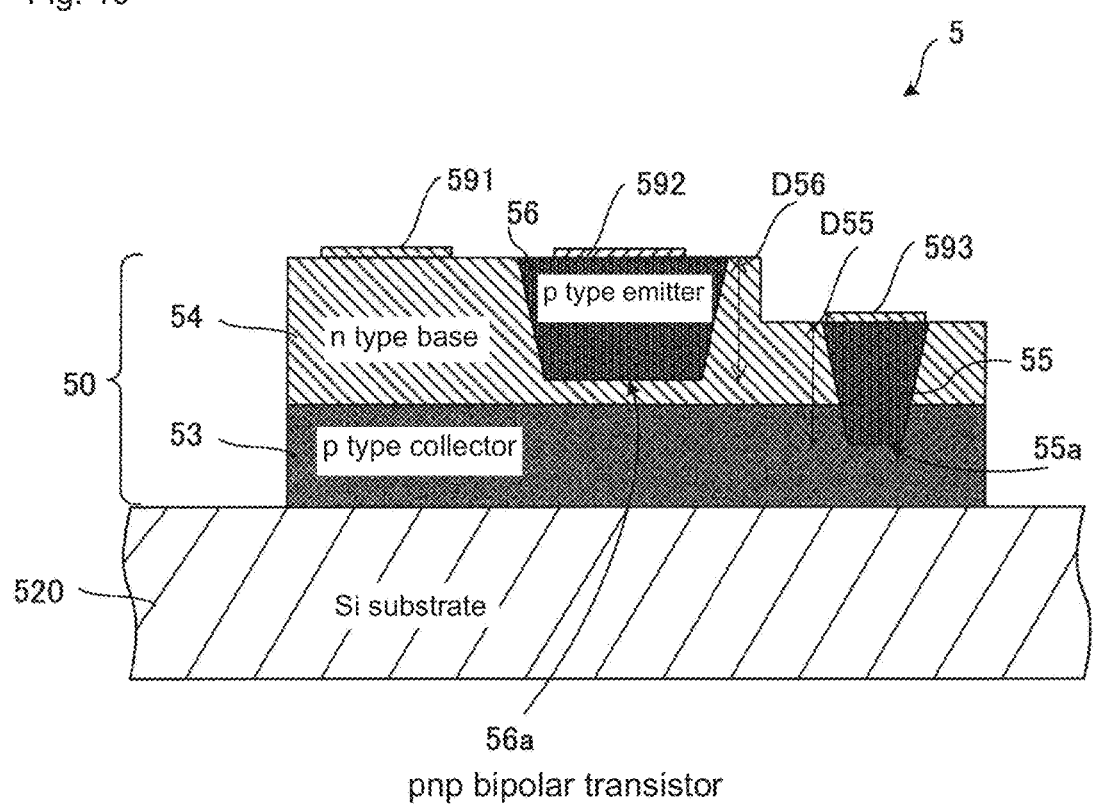
FIG. 10 is a schematic cross-sectional view of a structure of a semiconductor device (a bipolar transistor) according to a fifth embodiment.

FIG. 10 is a schematic cross-sectional view of a structure of semiconductor device 5 (pnp bipolar transistor 50) according to a fifth embodiment. As illustrated in FIG. 10, semiconductor device 5 includes semiconductor substrate 520 as a substrate and pnp bipolar transistor 50 that is provided on semiconductor substrate (Si substrate) 520 and that is driven by a drive circuit.

As illustrated in FIG. 10, semiconductor device 5 includes p type first semiconductor layer (p type collector layer) 53 that is provided on semiconductor substrate 520 and contains acceptors, n type second semiconductor layer (n type base layer) 54 that is provided on p type collector layer 53 and contains donors, and p type first diffusion portion 55 which includes contact portion 55a in contact with p type collector layer 53 and in which contact portion 55a contains acceptors whose concentration is higher than that in p type collector layer 53. First diffusion portion 55 penetrates n type base layer 54 and has a bottom in p type collector layer 53 midway through in the thickness direction thereof (the depth direction).

In addition, semiconductor device 5 further includes p type second diffusion portion (p type emitter layer) 56 that has bottom 56a in n type base layer 54 midway through in the thickness direction thereof, that is in contact with n type base layer 54, and that contains acceptors. N type base layer 54 includes a region with a first thickness and a region with a second thickness that is thinner than the first thickness. First diffusion portion 55 is arranged in the region with the second thickness. Second diffusion portion (p type emitter layer) 56 is arranged in the region with the first thickness. In a case where production is performed in the same process, height D55 of first diffusion portion 55 in the depth direction (the thickness direction) and height D56 of second diffusion portion 56 in the depth direction are the same. Semiconductor device 5 includes pnp bipolar transistor 50 that is controlled by a signal input to p type collector layer 53 through first diffusion portion 55.

For example, in the fifth embodiment, p type collector layer 53 is a p type AlGaAs layer, and n type base layer 54 is an n type AlGaAs layer. In these layers, C or Zn is used as a p type impurity, and Si is used as an n type impurity. In addition, first diffusion portion 55 and second diffusion portion 56 are formed by, for example, diffusing Zn using a solid phase diffusion method. Base electrode 591 is formed on an upper surface of n type base layer 54. Collector electrode 593 is formed on an upper surface of first diffusion portion 55. Emitter electrode 592 is formed on an upper surface of second diffusion portion 56.

<5-2> Process of Producing Semiconductor Device 5

FIGS. 11A to 11F illustrate schematic cross sections to explain a method of producing semiconductor device 5 (pnp bipolar transistor 50). Semiconductor device 5 is produced on production substrate 150 that is different from semiconductor substrate 520 illustrated in FIG. 10.

Figure 11A:
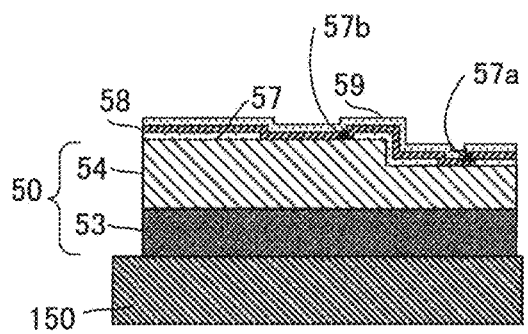
FIGS. 11A to 11F illustrate schematic cross sections for explaining a method of producing the semiconductor device (the bipolar transistor).

First, as illustrated in FIG. 11A, a stacked structure including p type collector layer 53 and n type base layer 54 is formed on production substrate 150 through epitaxial growth and impurity injection. Next, the region with the second thickness that is thinner than the first thickness is formed by, for example, applying a wet etching treatment to a part of n type base layer 54 with the first thickness. Next, diffusion mask 57 including openings 57b and 57a in the region with the first thickness and the region with the second thickness is formed on n type base layer 54, and diffusion source film (for example, ZnO) 58 is formed, and annealing cap film 59 is formed.

Figure 11D:
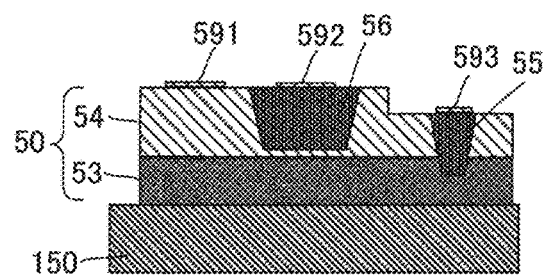
Figure 11B:
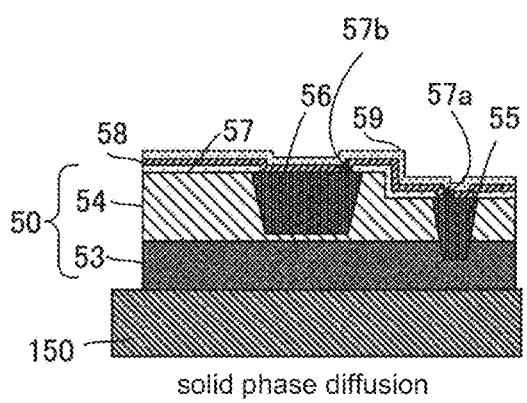

Next, as illustrated in FIG. 11B, Zn is diffused in a solid-phase manner through annealing, and p type first diffusion portion 55 and second diffusion portion 56 are formed.

Figure 11E:
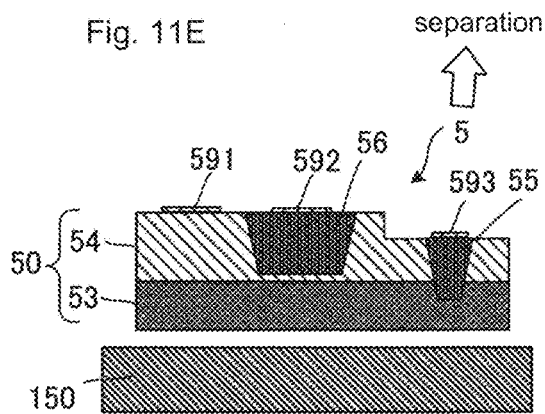
Figure 11C:
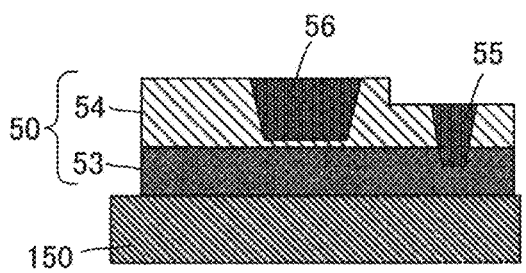

Next, as illustrated in FIG. 11C, annealing cap film 59, diffusion source film 58, and diffusion mask 57 are removed.

Figure 11F:
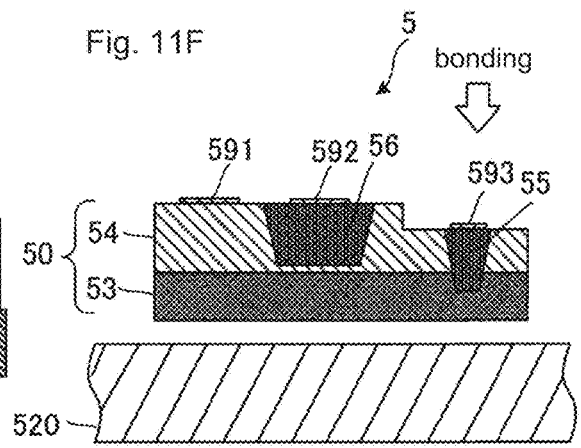

Next, as illustrated in FIG. 11D, base electrode 591, emitter electrode 592, and collector electrode 593 are formed. Thus, pnp bipolar transistor 50 is formed. Next, as illustrated in FIG. 11E, pnp bipolar transistor 50 is separated from production substrate 150, and is adhered to a predetermined position on semiconductor substrate 520 as illustrated in FIG. 11F.

<5-3> Effects

As described above, according to semiconductor device 5 of the fifth embodiment, first diffusion portion 55 formed using a solid phase diffusion method is used. This makes it possible to locally (only in first diffusion portion 55) increase an impurity concentration without increasing an impurity concentration of p type collector layer 53 formed through epitaxial growth. Therefore, it is possible to form favorable contact between first diffusion portion 55 and p type collector layer 53.

In addition, in solid phase diffusion illustrated in FIG. 11B, since an impurity concentration of p type collector layer 53 does not increase, a proportion of electrons which combine (recombine) with holes of p type collector layer 53 does not increase, and characteristics of bipolar transistor 50 do not deteriorate and power consumption does not increase.

Further, by diffusing Zn into n type base layer 54 using a solid phase diffusion method, it is possible to form second diffusion portion (p type emitter layer) 56 and first diffusion portion 55 in the same process, and therefore it is possible to simplify the production process.

<6> Sixth Embodiment

Figure 12:
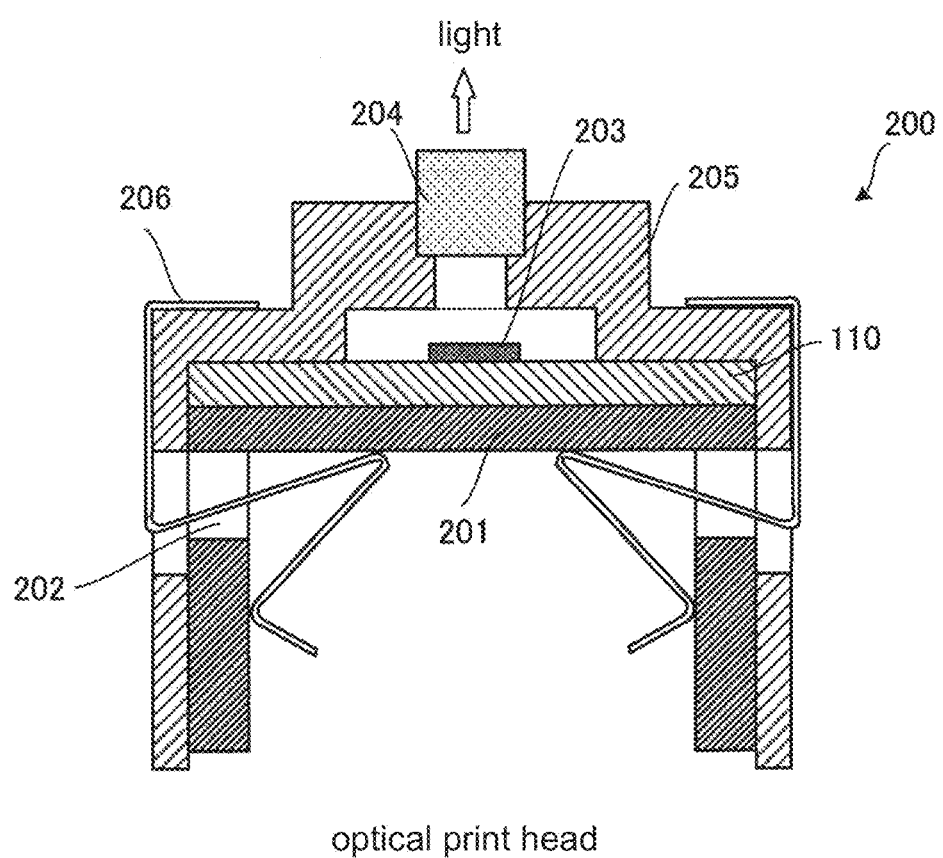
FIG. 12 is a schematic cross-sectional view of a structure of an optical print head according to one or more embodiments.

FIG. 12 is a cross-sectional view of a schematic structure of optical print head 200 according to one or more embodiments. Optical print head 200 is an exposure device of an electrophotographic printer as an electrophotographic image formation device. As illustrated in FIG. 12, optical print head 200 includes base member 201, COB substrate 110 (also illustrated in FIG. 1), light emission thyristor array chip 203 (for example, including semiconductor substrate 120 and light emission thyristor 10 illustrated in FIG. 1) as a light emission element array chip, lens array 204 including upright equal-magnification imaging lenses, lens holder 205, and clamper 206. Base member 201 is a member for fixing COB substrate 110 and has a side surface in which opening 202 for fixing COB substrate 110 and lens holder 205 to base member 201 using clamper 206 is provided. Lens holder 205 is formed by, for example, injection molding of an organic polymeric material or the like. COB substrate 110 is a unit in which light emission thyristor array chip 203 is integrated onto a substrate. Light emission thyristor array chip 203 includes, on a substrate (for example, semiconductor substrate 120 in FIG. 1) including a drive circuit, a light emission thyristor array (light emission thyristors bonded to the substrate). Lens array 204 is an optical lens group that forms an image of light emitted from the light emission thyristor array (light emission element array) of light emission thyristor array chip 203 on a photosensitive drum serving as an image carrier. Lens holder 205 holds lens array 204 at a predetermined position on base member 201. Clamper 206 is a spring member that penetrates through opening 202 of base member 201 and the opening of lens holder 205 to hold base member 201, lens holder 205, and COB substrate 110.

In the sixth embodiment, each of the light emission element parts of the light emission element array of optical print head 200 is any of semiconductor devices 1, 2, and 3 (light emission thyristors 10, 20, and 30) of the first, second and third embodiments.

In optical print head 200, the light emission thyristor array selectively emits light due to a drive circuit according to print data, and the light is formed, by lens array 204, as an image on the photosensitive drum that is uniformly charged. Accordingly, an electrostatic latent image is formed on the photosensitive drum. Then, a developer image is formed (printed) on print media (paper) through a developing process, a transferring process, and a fixing process.

As described above, according to optical print head 200 of the sixth embodiment, since it is possible to improve switching characteristics of the semiconductor device including the light emission thyristor and prevent a gate current from increasing, it is possible to reduce the power necessary for exposure of the photosensitive drum.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. A semiconductor device comprising:
   a p type first semiconductor layer that contains acceptors as impurities;
   an n type second semiconductor layer that is provided on the first semiconductor layer and contains donors as impurities; and
   a p type first diffusion portion that is provided in the second semiconductor layer and extends, in a thickness direction of the first and second semiconductor layers, from a top surface of the second semiconductor layer through the second semiconductor layer to the first semiconductor layer, wherein the first diffusion portion includes a bottom as a contact portion provided between a top surface of the first semiconductor layer and a bottom surface of the first semiconductor layer in the thickness direction and in contact with the first semiconductor layer, the contact portion containing acceptors whose concentration is higher than that in the first semiconductor layer.

2. The semiconductor device according to claim 1, further comprising:
   a p type third semiconductor layer that contains acceptors as impurities; and
   an n type fourth semiconductor layer that is provided on the third semiconductor layer and contains donors as impurities, wherein
   the first semiconductor layer is provided on the fourth semiconductor layer, and
   the third semiconductor layer is a p type anode layer, the fourth semiconductor layer is an n type gate layer, the first semiconductor layer is a p type gate layer, the second semiconductor layer is an n type cathode layer, and the semiconductor device is a light emission thyristor that is controlled by a gate signal input to the first semiconductor layer through the first diffusion portion.

3. The semiconductor device according to claim 1, further comprising:
   an n type third semiconductor layer that contains donors as impurities; and
   a p type second diffusion portion that includes a bottom in the second semiconductor layer, is in contact with the second semiconductor layer, and contains acceptors as impurities, wherein
   the first semiconductor layer is provided on the third semiconductor layer, and
   the third semiconductor layer is an n type cathode layer, the first semiconductor layer is a p type gate layer, the second semiconductor layer is an n type gate layer, the second diffusion portion is a p type anode layer, and the semiconductor device is a light emission thyristor that is controlled by a gate signal input to the first semiconductor layer through the first diffusion portion.

4. The semiconductor device according to claim 3, wherein
   the second semiconductor layer includes a region with a first thickness and a region with a second thickness that is thinner than the first thickness, and
   the first diffusion portion is arranged in the region with the second thickness, the second diffusion portion is arranged in the region with the first thickness, and a height of the first diffusion portion in the thickness direction thereof and a height of the second diffusion portion in the thickness direction thereof are the same.

5. The semiconductor device according to claim 1, further comprising an n type third semiconductor layer that contains donors as impurities, wherein
   the first semiconductor layer is provided on the third semiconductor layer, and
   the third semiconductor layer is an n type collector layer, the first semiconductor layer is a p type base layer, the second semiconductor layer is an n type emitter layer, and the semiconductor device is a bipolar transistor that is controlled by a base signal input to the first semiconductor layer through the first diffusion portion.

6. The semiconductor device according to claim 1, further comprising a p type second diffusion portion that includes a bottom in the second semiconductor layer, is in contact with the second semiconductor layer, and contains acceptors as impurities, wherein
   the first semiconductor layer is a p type collector layer, the second semiconductor layer is an n type base layer, the second diffusion portion is a p type emitter layer, and the semiconductor device is a bipolar transistor that is controlled by a collector signal input to the first semiconductor layer through the first diffusion portion.

7. The semiconductor device according to claim 6, wherein
   the second semiconductor layer includes a region with a first thickness and a region with a second thickness that is thinner than the first thickness, and
   the first diffusion portion is arranged in the region with the second thickness, the second diffusion portion is arranged in the region with the first thickness, and a height of the first diffusion portion in the thickness direction thereof and a height of the second diffusion portion in the thickness direction thereof are the same.

8. The semiconductor device according to claim 1, wherein
   the first semiconductor layer includes a first region that is not covered with the second semiconductor layer, and the bottom of the first diffusion portion is located in the first semiconductor layer in the thickness direction.

9. The semiconductor device according to claim 8, further comprising:
   a p type third semiconductor layer that contains acceptors as impurities; and
   an n type fourth semiconductor layer that is provided on the third semiconductor layer and contains donors as impurities, wherein
   the first semiconductor layer is provided on the fourth semiconductor layer, and
   the third semiconductor layer is a p type anode layer, the fourth semiconductor layer is an n type gate layer, the first semiconductor layer is a p type gate layer, the second semiconductor layer is an n type cathode layer, and the semiconductor device is a light emission thyristor that is controlled by a gate signal input to the first semiconductor layer through the first diffusion portion.

10. The semiconductor device according to claim 1, wherein impurities diffused into the first diffusion portion are zinc.

11. The semiconductor device according to claim 3, wherein impurities diffused into the first diffusion portion and the second diffusion portion are zinc.

12. The semiconductor device according to claim 6, wherein impurities diffused into the first diffusion portion and the second diffusion portion are zinc.

13. The semiconductor device according to claim 1, further comprising:
   a first electrode provided on a top surface of the first diffusion portion whose bottom as the contact portion is in contact with the first semiconductor layer; and
   a second electrode provided on the top surface, outside of an area corresponding to the first diffusion portion, of the second semiconductor layer.

14. A light emission element array comprising:
   light emission elements; and
   a drive circuit configured to drive the light emission elements, wherein
   each of the light emission elements is the semiconductor device according to claim 1.

15. An optical print head comprising the light emission element array according to claim 14.

* * * * *